(12) United States Patent
Widdowson et al.

(10) Patent No.: US 9,024,690 B2
(45) Date of Patent: May 5, 2015

(54) AMPLIFIER LINEARIZATION USING NON-STANDARD FEEDBACK

(75) Inventors: Scott Widdowson, Ottawa (CA); Gregory Bowles, Nepean (CA); Arthur Fuller, Carp (CA)

(73) Assignee: RPX Clearinghouse LLC, San Francisco, CA (US)

(*) Notice: Subject to any disclaimer, the term of this patent is extended or adjusted under 35 U.S.C. 154(b) by 0 days.

(21) Appl. No.: 14/131,131

(22) PCT Filed: Jul. 11, 2011

(86) PCT No.: PCT/CA2011/050421
§ 371 (c)(1),
(2), (4) Date: Jan. 6, 2014

(87) PCT Pub. No.: WO2013/006943
PCT Pub. Date: Jan. 17, 2013

(65) Prior Publication Data
US 2014/0125416 A1    May 8, 2014

(51) Int. Cl.
*H03F 3/68* (2006.01)
*H03F 1/36* (2006.01)
(Continued)

(52) U.S. Cl.
CPC ............ *H03F 1/3241* (2013.01); *H03F 1/0277* (2013.01); *H03F 1/3247* (2013.01); *H03F 3/193* (2013.01); *H03F 3/211* (2013.01); *H03F 1/3205* (2013.01); *H03F 1/0288* (2013.01);
(Continued)

(58) Field of Classification Search
USPC .................................. 330/295, 124 R, 53, 75
See application file for complete search history.

(56) References Cited

U.S. PATENT DOCUMENTS

| 5,061,938 A | 10/1991 | Zahn et al. |
| 6,252,461 B1* | 6/2001 | Raab .............................. 330/302 |

(Continued)

FOREIGN PATENT DOCUMENTS

| WO | 2004088837 A2 | 10/2004 |
| WO | 2008042709 A2 | 4/2008 |

(Continued)

OTHER PUBLICATIONS

Ang, Kian Sen, et al., "A Broad-Band Quarter-Wavelength Impedance Transformer With Three Reflection Zeros Within Passband," IEEE Transactions on Microwave Theory and Techniques, Dec. 2004, pp. 2640-2644, vol. 52, No. 12, IEEE.

(Continued)

*Primary Examiner* — Patricia T Nguyen
(74) *Attorney, Agent, or Firm* — Conley Rose, P.C.; Rodney B. Carroll

(57) ABSTRACT

An amplification unit is provided. The amplification unit, comprises a first amplifier, a second amplifier, a first sensor, a first predistortion component, and a signal combiner. The first amplifier amplifies a first signal to produce a second signal. The first sensor produces a third signal based on the second signal. The second amplifier turns on and to amplifies a fourth signal to produce a fifth signal when the amplitude of the fourth signal exceeds a threshold amplitude and turns off when the amplitude of the fourth signal is less than the threshold amplitude. The first predistortion component produces the first signal based on a first input signal, based on the third signal, and based on an on-off state of the second amplifier. The signal combiner produces an output of the amplification unit based on the second signal and the fifth signal.

20 Claims, 4 Drawing Sheets

(51) Int. Cl.
*H03F 1/32* (2006.01)
*H03F 1/02* (2006.01)
*H03F 3/193* (2006.01)
*H03F 3/21* (2006.01)
*H03F 3/24* (2006.01)

(52) U.S. Cl.
CPC .............. *H03F 1/0294* (2013.01); *H03F 3/245* (2013.01); *H03F 2200/462* (2013.01)

(56) References Cited

U.S. PATENT DOCUMENTS

| | | |
|---|---|---|
| 6,275,685 B1 | 8/2001 | Wessel et al. |
| 6,664,935 B1 | 12/2003 | Thompson et al. |
| 7,541,866 B2 | 6/2009 | Bowles et al. |
| 7,961,045 B2 | 6/2011 | Morris et al. |
| 8,022,768 B1 | 9/2011 | Bowles et al. |
| 8,098,092 B2 | 1/2012 | Miyashita et al. |
| 8,653,890 B1* | 2/2014 | Ahmed et al. ............ 330/124 R |
| 8,706,062 B1* | 4/2014 | Yu et al. ................... 455/127.1 |
| 2004/0246048 A1* | 12/2004 | Leyonhjelm et al. ............. 330/2 |
| 2008/0265996 A1* | 10/2008 | Kim et al. ...................... 330/291 |
| 2009/0163154 A1* | 6/2009 | Fonden et al. .............. 455/114.2 |
| 2010/0148862 A1 | 6/2010 | Woo |
| 2010/0225389 A1* | 9/2010 | Teetzel .......................... 330/149 |

FOREIGN PATENT DOCUMENTS

| | | |
|---|---|---|
| WO | 2011048893 A1 | 4/2011 |
| WO | 2013006941 A1 | 1/2013 |
| WO | 2013006943 A1 | 1/2013 |

OTHER PUBLICATIONS

Filing receipt and specification for patent application entitled "Broadband Doherty Amplifier Using Broadband Transformer," by Noureddine Outaleb, filed on Jan. 6, 2014 as U.S. Appl. No. 14/131,155.

Foreign communication from the priority application—International Search Report and Written Opinion, PCT/CA2011/000799, Mar. 30, 2012, 10 pages.

Foreign communication from the priority application—International Preliminary Report on Patentability, PCT/CA2011/000799, Jan. 14, 2014, 7 pages.

Foreign communication from the priority application—International Search Report and Written Opinion, PCT/CA2011/050421, Mar. 20, 2012, 7 pages.

Foreign communication from the priority application—International Preliminary Report on Patentability, PCT/CA2011/0505421, Jan. 14, 2014, 5 pages.

Zhang, Qiaoli, et al., "Coupled-Line Directional Coupler Based on Composite Right / Left-Handed Coplanar Waveguides," 2008, 4 pages, IEEE.

* cited by examiner

AMPLIFIER LINEARIZATION USING NON-STANDARD FEEDBACK

CROSS-REFERENCE TO RELATED APPLICATIONS

This application is a filing under 35 U.S.C. 371 of International Application No. PCT/CA2011/050421 filed Jul. 11, 2011, entitled "Amplifier Linearization Using Non-Standard Feedback," which application is incorporated by reference herein in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Power amplifiers may be employed in a variety of electronics applications, including wireless communications. Generally speaking, power amplifiers amplify an input electrical signal to produce an output electrical signal that has increased amplitude relative to the input. Base transceiver stations, enhanced nodes B, and/or cell sites may incorporate one or more radio frequency power amplifiers to boost the power of a signal prior to emitting from an antenna and/or antenna array. Portable electronic devices likewise may incorporate power amplifiers to boost the power of a signal prior to emitting from an antenna. A variety of operating parameters of power amplifiers are of special concern in the wireless environment. For example, regulatory agencies may constrain the emission of spurious signals outside an authorized spectrum of frequencies, thus raising the importance for power amplifiers to reduce spurious spectral emissions. Excess power consumption by power amplifiers is undesirable because this reduces battery life of portable electronic devices, potentially reducing user satisfaction with the devices, and/or increases the expense of operating base transceiver sites, enhanced nodes B, and/or cell sites.

The Doherty amplifier architecture has become widely used as a power amplifier in some wireless communication applications. While the Doherty amplifier may be implemented in a variety different structures, generally the Doherty amplifier comprises a main amplifier and an auxiliary amplifier (also known as a carrier amplifier and a peak amplifier, respectively). In some contexts, the main amplifier may be referred to as a carrier amplifier and the auxiliary amplifier may be referred to as a peaking amplifier. The auxiliary amplifier is operated in a turned off state while the input to the Doherty amplifier remains below an amplitude threshold, and the output of the Doherty amplifier is then provided by the output of the main amplifier alone. The auxiliary amplifier is operated in a turned on state while the input to the Doherty amplifier is at or above the amplitude threshold, and the output of the Doherty amplifier is then provided by the combination of the outputs of both the main amplifier and the auxiliary amplifier. The auxiliary amplifier of the typical Doherty amplifier may be said to be biased for Class C operation.

The LINC (linear amplification with nonlinear components) amplifier features a signal splitter feeding an input having a constant amplitude envelope to each of two amplifiers each producing an output having a substantially constant amplitude envelope. The information content of the input is substantially a phase signal. The outputs of the two amplifiers are combined to produce the output of the LINC amplifier unit, where this output is of varying amplitude by virtue of the input phase modulation and the summing process. The constant envelope input signals promote high efficiency.

SUMMARY

In an embodiment, an amplification unit is disclosed. The amplification unit comprises a first amplifier, a first sensor, a second amplifier, a first predistortion component, and a signal combiner. The first amplifier is operable to amplify a first signal to produce a second signal. The first sensor is operable to produce a third signal based on the second signal. The second amplifier is operable to turn on and to amplify a fourth signal to produce a fifth signal when the amplitude of the fourth signal exceeds a threshold amplitude and to turn off when the amplitude of the fourth signal is less than the threshold amplitude. The first predistortion component is operable to produce the first signal based on a first input signal, based on the third signal, and based on an on-off state of the second amplifier. The signal combiner is operable to produce an output of the amplification unit based on the second signal and the fifth signal.

In an embodiment, an amplification unit is disclosed. The amplification unit comprises a first amplifier that receives a first signal and outputs a second signal, wherein the first amplifier amplifies the first signal to produce the second signal and a sensor that senses the second signal and outputs a third signal, wherein the third signal is based on the second signal. The amplification unit further comprises a second amplifier that receives a fourth signal and that outputs a fifth signal, wherein the second amplifier amplifies the fourth signal to produce the fifth signal, and a predistortion component that determines predistortion values based at least in part on the third signal and that outputs the first signal based on a first input signal and the predistortion values. The amplification unit further comprises a signal combiner, wherein the signal combiner outputs a sixth signal based on the second signal and based on the fifth signal, wherein the sensor is located between the output of the first amplifier and the signal combiner.

In an embodiment, an amplification unit is disclosed. The amplification unit comprises a first amplifier, a current monitor, a second amplifier, a predistortion component, and a signal combiner. The first amplifier receives a first signal and outputs a second signal. The first amplifier comprises a field effect transistor (FET), wherein the field effect transistor amplifies the first signal to produce the second signal. The current monitor senses a current associated with the second signal and outputs a third signal. The second amplifier receives a fourth signal and outputs a fifth signal based on the fourth signal. The predistortion component determines predistortion values based on the third signal and based on an operating state of the second amplifier. The predistortion component outputs the first signal based on a first input signal and the predistortion values. The signal combiner outputs a sixth signal based on the second signal and based on the fifth signal.

In an embodiment, a method of amplifying electronic signals to produce a radio frequency output is disclosed. The method comprises amplifying a first input to produce an output of a second amplifier, wherein the second amplifier operates in an on state or in an off state and determining a first predistortion based on an output of a first amplifier and based on whether the second amplifier is operating in the on state or in the off state. The method further comprises amplifying a second input to produce an output of a first amplifier, wherein the second input is based on a third input and based on the first predistortion and combining the output of the first amplifier and the output of the second amplifier to produce a radio frequency output.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

Figure 1:
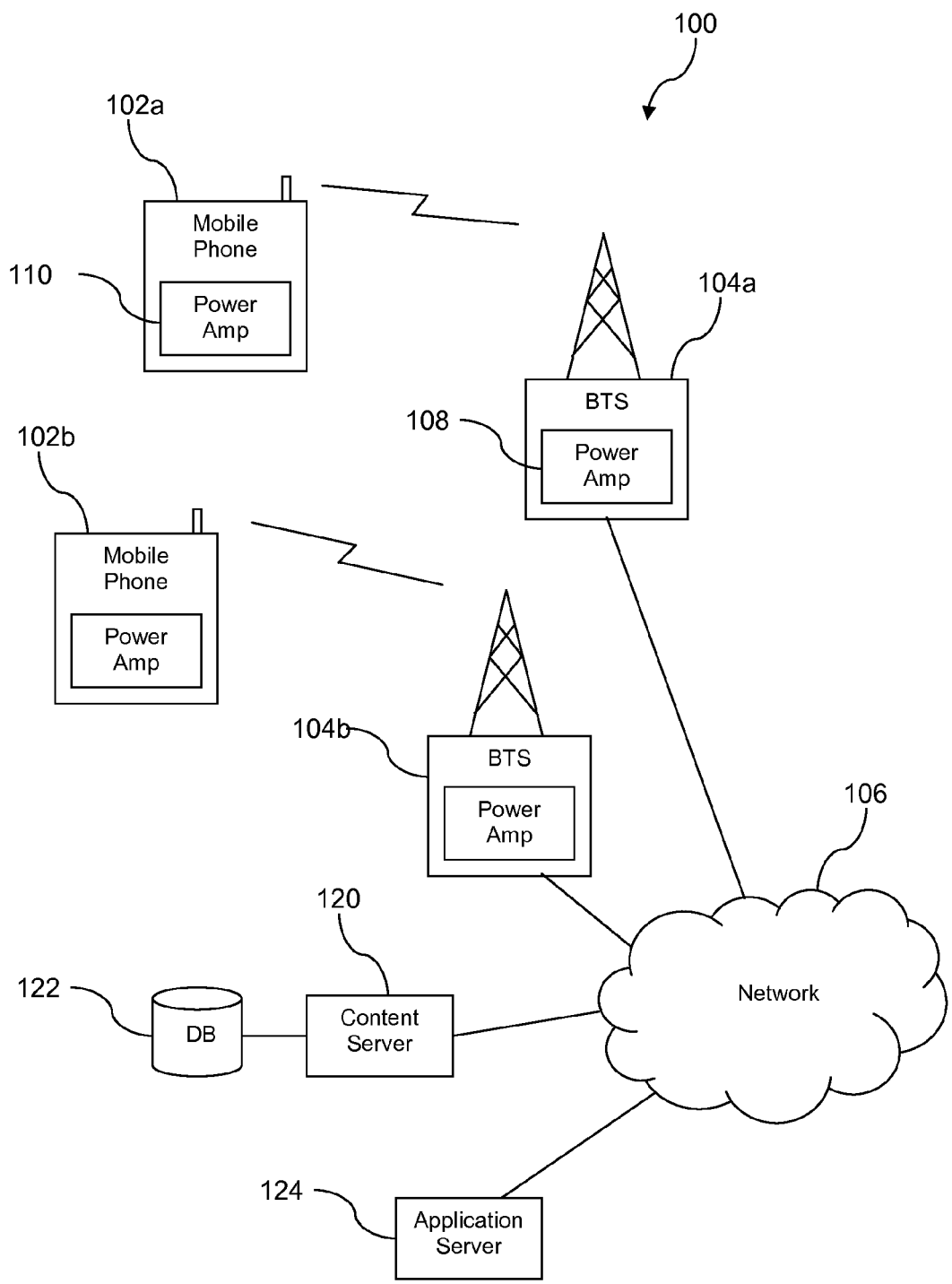
FIG. 1 is an illustration of a wireless communication system according to an embodiment of the disclosure.

Turning now to FIG. 1, a wireless communication system 100 is described. The system 100 comprises mobile phones 102, base transceiver stations 104, and network 106. A first mobile phone 102a may communicate with a second mobile phone 102b, for example to carry on a voice conversation, via the base transceiver stations 104 and the network 106. A first base transceiver station 104a provides a wireless communication link to the first mobile phone 102a and couples it to the network 106. A second base transceiver station 104b provides a wireless communication link to the second mobile phone 102b and couples it to the network 106. The network 106 may be any combination of one or more public networks and/or one or more private networks.

The base transceiver station 104 may provide wireless communication links using any of a variety of wireless communication protocols for example, but not by way of limitation, code division multiple access (CDMA), global system for mobile communications (GSM), long-term evolution (LTE), worldwide interoperability for microwave access (WiMAX), WiFi, or other wireless communication protocol. In some contexts the base transceiver station 104 may be referred to as an enhanced node B or a cell tower or access point or some other term. As used herein, the base transceiver station 104 and/or cell tower is understood to comprise an antenna and a BTS power amplifier (108). The mobile phone 102 comprises a mobile power amplifier 110. In an embodiment, the power amplifiers 108, 110 boost output power levels of the base transceiver station 104 and the mobile phone 102, respectively, to a level that promotes an acceptable quality wireless communication link. While the description of FIG. 1 is based on a mobile phone 102, it is understood that other portable electronic devices, for example personal digital assistants (PDAs), media players, air interface cards embedded in or coupled to laptop computers or other portable computers may likewise feature a power amplifier 110 and engage in wireless communications with the network 106 via a wireless link provided by the base transceiver station 104.

It is understood that the performance of the power amplifiers 108, 110 may affect the system 100 in various ways. The economic efficiency of the base transceiver station 104 may be improved by increasing the efficiency of the BTS power amplifier 108, for example by reducing the annual cost of electrical power consumption associated with the base transceiver station 104. The compliance of the base transceiver station 104 with regulatory requirements such as the Federal Communication Commission (FCC) wireless spectrum regulations may be promoted by better linearizing the BTS power amplifier 108. The battery life of the mobile phone 102 may be extended by using a more efficient mobile power amplifier 110, thereby increasing customer satisfaction. The present disclosure teaches a plurality of approaches to improving the power amplifiers 108, 110 and thereby improving the profitability and service of the system 100.

In an embodiment, the power amplifier 108, 110 may be implemented as a plurality of power amplifier paths. For example, the power amplifier 108, 110 may be implemented as a Doherty-type of amplification unit having a main amplifier and an auxiliary amplifier, where the output of the amplification unit is based on combining the outputs of the main amplifier and the auxiliary amplifier. Alternatively, the power amplifier 108, 110 may be implemented as a LINC amplification unit having a first amplifier path and a second amplifier path where the output of the amplification unit is based on combining the outputs of the first amplifier path and the second amplifier path. Yet other architectures of power amplifiers 108, 110 are contemplated by the present disclosure wherein an amplification unit comprises two or more amplification paths and wherein the output of the subject amplification unit is based on combining the outputs of the two or more amplification paths. The present disclosure teaches sensing the output of the two or more amplifier paths, before combining to produce the output of the amplification unit, and feeding the sensed path outputs to a path adapter component, for example to a predistortion component, to promote adapting the performance of the subject amplifier path. An amplification unit having two amplifier paths—such as a LINC amplification unit, such as a Doherty amplification unit, and such as other amplification units having two amplifier paths—may be said to have a first amplifier and a second amplifier. While the following disclosure describes the application of this novel power amplifier concept in the context of a Doherty-type amplifier, it is understood that this same sensing-adaptation concept is contemplated for use in other amplification unit architectures that feature two or more amplification paths.

Figure 2:
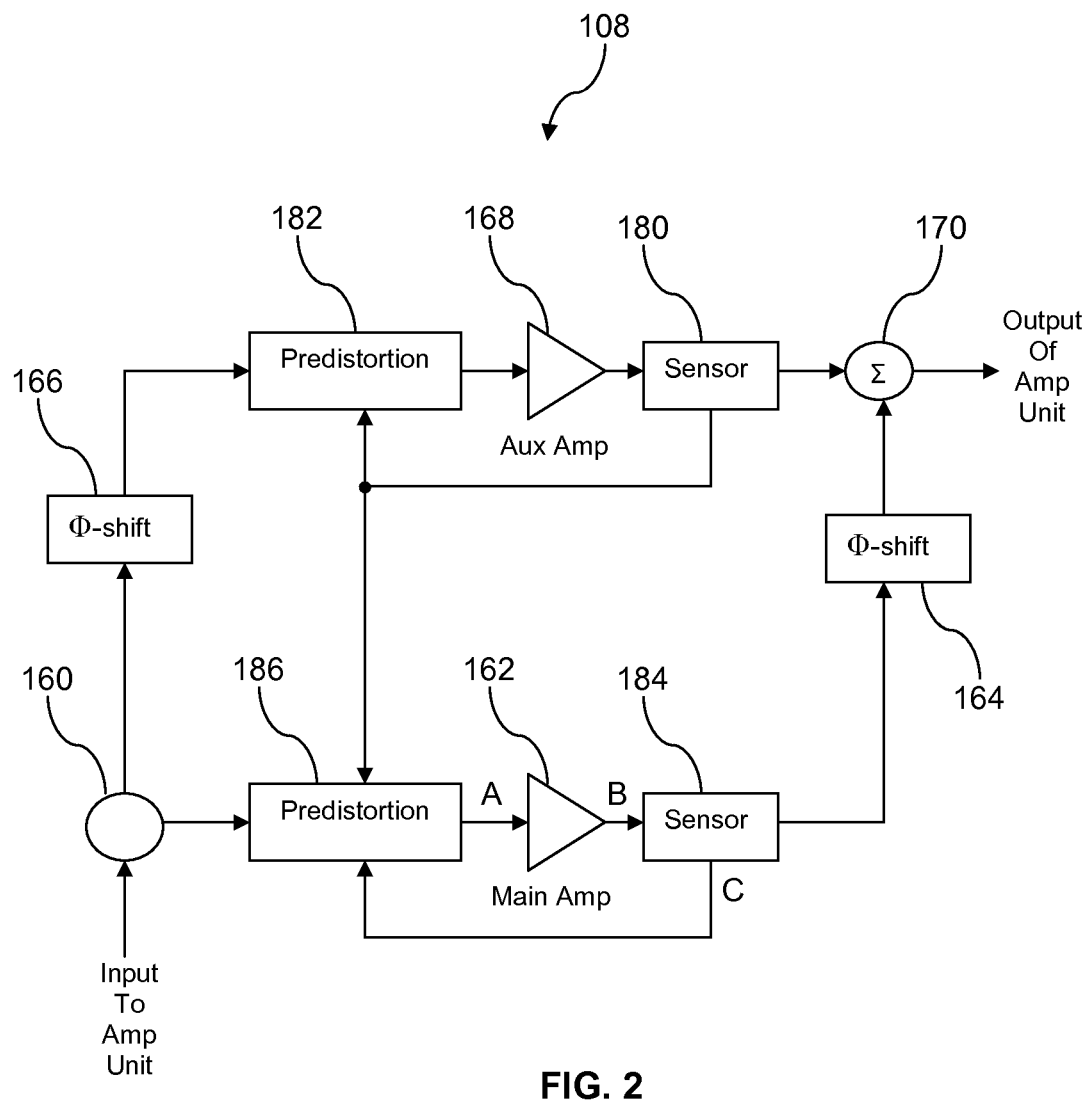
FIG. 2 is an illustration of a power amplifier according to an embodiment of the disclosure.

Turning now to FIG. 2, details of an embodiment of the power amplifier 108 are described. It is understood that the description of the power amplifier 108 may apply equally to the power amplifier 110 embodied in the mobile phone 102. In an embodiment, the power amplifier 108 comprises a signal splitter 160, a main amplifier 162, an output transformer 164, an input phase shifter 166, an auxiliary amplifier 168, and an output combiner 170. In some contexts, the main amplifier 162 may be referred to as a first amplifier, and the auxiliary amplifier 168 may be referred to as a second amplifier. The components enumerated above correspond substantially to a typical Doherty-type amplification unit. An input to the power amplifier 108 may be split, and a first portion of the input signal propagates to the main amplifier 162 that amplifies the first portion of the input signal. A second portion of the input signal is propagated to the input phase shifter 166. The input phase shifter 166 shifts the phase of the second portion of the input signal relative to the phase of the first portion of the input signal. In an embodiment, the phase shift created by the input phase shifter 166 may be about 90 degrees and/or ¼ wavelength.

In other embodiments, however, for example in an embodiment wherein an output transistor of the main amplifier 162 and an output transistor of the auxiliary amplifier 168 are formed of different materials and/or of different semiconductor families from each other, the phase shift created by the input phase shifter 166 may be different from 90 degrees and/or ¼ wavelength. The fabrication and use of power amplification units having an output transistor of a main amplifier formed of a first material having a first material composition and belonging to a first semiconductor family and having an output transistor of an auxiliary amplifier formed of a second material having a second material composition and belonging to a second semiconductor family, wherein at least one of the first material composition is different from the second material composition and the first semiconductor family is different from the second semiconductor family, is described in detail in U.S. Pat. No. 7,541,866 filed Sep. 29, 2006, issued Jun. 2, 2009, entitled "Enhanced Doherty Amplifier with Asymmetrical Semiconductors," by Gregory Bowles, et al., which is incorporated by reference herein in its entirety.

In one mode of operation, for example when the input signal exceeds a threshhold amplitude that is associated with the auxiliary amplifier 168 operating in an ON operation mode, the first portion of the input signal is amplified by the main amplifier 162, and the second portion of the input signal is amplified by the auxiliary amplifier 168. The output of the main amplifier 162 is transformed by the output transformer 164. In an embodiment, the output transformer 164 matches the main amplifier 162 to promote radio frequency (RF) signal propagation from the output of the power amplifier 108 to an antenna. The output transformer 164 introduces a phase shift into the output of the main amplifier 162, for example an about 90 degree and/or ¼ wavelength phase shift. The phase shift introduced into the second portion of the input signal by the input phase shifter 166 results in the output of the auxiliary amplifier 168 combining substantially in-phase with the output of the output transformer 164 at the output combiner 170. It is understood that this description of the operation of the power amplifier 108 is abstract and omits some details that are discussed further hereinafter.

In an embodiment, it is desirable that the output of the power amplifier 108 be substantially linearly related to the input. Alternatively, in another embodiment, it is desirable that the output of the power amplifier 108 has some other non-linear but predefined relationship to the input. The relationship between the input and the output of the power amplifier 108 may be referred to in some contexts as the transfer function of the power amplifier 108. Because of the limitations of the components and/or the bias point of the amplifiers 162, 168, because of changing environmental conditions, and because of other factors, the transfer function of the power amplifier 108 may deviate unacceptably from the desired transfer function if correction means are not employed. Therefore, the power amplifier 108 incorporates path-wise predistortion to promote the power amplifier 108 achieving the desired transfer function. The term 'path-wise predistortion' means that predistortion is performed independently on each of the two or more amplification paths of the power amplifier 108.

Pathwise predistortion may promote achieving a desired transfer function of the power amplifier 108 as a whole. Further, pathwise predistortion may promote achieving a desired first transfer function of the main amplifier 162 and a second transfer function of the auxiliary amplifier 168. The ability to adapt the transfer function of the main amplifier 162 independently from the adaptation of the transfer function of the auxiliary amplifier 168 using path-wise predistortion may promote achieving greater fidelity to the desired transfer function of the power amplifier 108 as a whole. Additionally, independent adaptation of the transfer functions of the main amplifier 162 and the auxiliary amplifier 168 using path-wise predistortion may promote new amplification features that are difficult to achieve otherwise.

In an embodiment, a first sensor 180 detects the amplitude and phase of the output of the auxiliary amplifier 168 and provides an indication of this amplitude and phase to a first predistortion component 182. Based on the second portion of the input signal and based on the indication of the amplitude and phase output by the auxiliary amplifier 168 that is provided by the first sensor 180, the first predistortion component 182 determines a predistorted value to input to the auxiliary amplifier 168 such that the desired transfer function of the auxiliary amplifier 168 is substantially achieved. In an embodiment, a second sensor 184 detects the amplitude and phase of the output of the main amplifier 162 and provides an indication of this amplitude and phase to a second predistortion component 186. Based on the first portion of the input signal, based on the indication of the amplitude and phase output by the main amplifier 162 that is provided by the second sensor 184, and based on the indication of the amplitude and phase output by the auxiliary amplifier 168 that is provided by the first sensor 180, the second predistortion component 186 determines a predistorted value to input to the main amplifier 162 such that the desired transfer function of the main amplifier 162 is substantially achieved.

The second predistortion component 186 uses the indication of the amplitude and phase output by the auxiliary amplifier 168 provided by the first sensor 180 to determine the operating state of the auxiliary amplifier 168. For example, in an embodiment, the second predistortion component 186 uses the indication of the amplitude and phase output by the auxiliary amplifier provided by the first sensor 180 to determine whether the auxiliary amplifier 168 is operating in an ON state of operation or an OFF state of operation. When the auxiliary amplifier 168 is operated in an OFF state of operation, the output transistor of the auxiliary amplifier 168 presents a high impedance at its output, and the main amplifier 162 sees a first impedance.

As used herein the term ON state of operation refers to an operating state of the auxiliary amplifier 168 where the auxiliary amplifier 168 provides significant gain rather than merely the conduction of DC current. For example, the auxiliary amplifier 168 may be considered to be in the ON state of operation when providing at least 3 dB of gain. Alternatively, the auxiliary amplifier 168 may be considered to be in the ON state of operation when providing at least 9 dB of gain. Alternatively, the auxiliary amplifier 168 may be considered to be in the ON state of operation when providing at least 18 dB of gain. Alternatively, the auxiliary amplifier 168 may be considered to be in the ON state of operation when providing at least 27 dB of gain. Alternatively, some other gain threshold may be defined that distinguishes the ON state of operation of the auxiliary amplifier 168. It is understood that the auxiliary amplifier 168 may undergo intermediate operation states between the ON state and the OFF state. In an embodiment, the ON state of operation of the auxiliary amplifier 168 may alternatively be defined based on a threshold AC current amplitude.

When the auxiliary amplifier 168 is operated in an ON state of operation, the output transistor of the auxiliary amplifier 168 presents a low impedance at its output, and the main amplifier 162 sees a second impedance. The second predistortion component 186 interprets the indication of the amplitude and phase output by the main amplifier 162 provided by the second sensor 184 based on the knowledge of the impedance seen by the main amplifier 162, which may be referred to as the imputed impedance and/or the estimated impedance seen by the main amplifier 162. For example, in an embodiment, the second sensor 184 comprises a current monitor and provides an indication of current to the second predistortion component 186. The second predistortion component 186 converts the current (I) indication to a voltage (V) indication based on Ohms law (in a direct current situation, voltage=current times resistance [V=IR]; in an alternating current situation, voltage=current times impedance [V=IZ]); and based on an imputed value of the impedance (Z) seen by the main amplifier 162, where the imputed value of impedance changes based on the ON state and the OFF state of the auxiliary amplifier 168.

In practice, when the auxiliary amplifier 168 transitions between the OFF state and the ON state, the impedance presented by the output transistor of the auxiliary amplifier 168 takes on a range of impedance values that are between the high impedance value seen in the OFF state and the low impedance value seen in the ON state. In some embodiments, these transitional impedance values are ignored and the second predistortion component 186 determines the predistorted value to input to the main amplifier 162 based only on one of the high impedance or low impedance imputed to the auxiliary amplifier 168. In another embodiment, however, the second predistortion component 186 comprises a model of the auxiliary amplifier 168 that maps or transforms the indication of the amplitude and phase of the auxiliary amplifier 168 provided by the first sensor 180 to an imputed impedance seen by the main amplifier 162. This impedance mapping can define intermediate, transitional impedance values that are seen when the auxiliary amplifier 168 is not fully OFF and not fully ON, thereby promoting more accurate determination of predistorted input values to provide to the main amplifier 162. Of course, the impedance mapping may also include the fully OFF impedance and the fully ON impedance as well. In this embodiment, the second predistortion component 186 determines the predistorted value to input to the main amplifier 162 based on the imputed and/or estimated impedance value determined based on the impedance mapping described above.

In an embodiment, the impedance mapping may be defined by a look-up table where values of phase and amplitude sensed by the first sensor 180 that match entries in the look-up table map directly to an imputed impedance stored in the corresponding entry in the look-up table while and where values of phase and amplitude sensed by the first sensor 180 that fall between the entries of the look-up table are linearly extrapolated between the imputed impedance values associated with the bounding phase and amplitude entries of the look-up table. The number of entries or points defined in the look-up table can be determined based on balancing the value of an increased level of fidelity and/or accuracy associated with a greater number of entries versus the cost of increased memory consumption and/or greater computational effort. In an embodiment, the impedance mapping may be defined by a function, such as a polynomial function with predefined constants for offset and multiplicative coefficients. In another embodiment, yet other processes for mapping phase and amplitude values sensed by the first sensor 180 to imputed impedance values may be employed by the second predistortion component 186.

In an embodiment, the second predistortion component 186 determines predistortion values based on determining an amplitude difference and a phase difference between the first portion of the input signal to the calculated signal output by the main amplifier 162. The sensed amplitude of the output of the main amplifier 162 provided by the second sensor 184 may be scaled suitably to promote appropriate comparison between the unamplified level of the first portion of the input signal and the amplified level of the output of the main amplifier 162. Either the second predistortion component 186 or the second sensor 184 may provide the scaling. In an embodiment, the scaling may be combined with a transformation of a current indicator to a voltage indicator based on the impedance mapping described above. Alternatively, the scaling may be performed as a series operation either before or after the transformation of the current indication to the voltage indication.

The amplitude difference is used to determine an amplitude predistortion value by which to boost the first portion of the input signal and the phase difference is used to determine a phase predistortion value by which to phase shift the first portion of the input signal. The second predistortion component 186 may store predistortion values associated with each of a plurality of values of the first portion of the input signal in a look-up table. The values selected for indexing into the look-up table, which correspond to the values of the first portion of the input signal, may be evenly distributed through the range of values that the first portion of the input signal may take on. Alternatively, the values selected for indexing into the look-up table may be distributed in some other way, for example to more accurately capture the desired predistortion values, for example selecting the values more densely in a local region of the first portion of the input signal where the desired predistortion values are changing most rapidly. The number of entries in the look-up table may vary in different embodiments. In combination with the present disclosure, one skilled in the art will readily be able to determine a number of entries to include in the look-up table to balance the desire for providing accurate predistortion versus conserving memory space and reducing predistoration value calculation processing load.

The second predistortion component 186 may update the look-up table of predistortion values occasionally, for example on a periodic basis or alternatively based on exceeding a threshhold amount of change between the current calculations of predistortion values versus the predistortion values stored in the look-up table. The transfer function of the main amplifier 162 may change over time in response to changed environmental conditions such as heat, in response to the physical evolution of electronic components, and in response to other factors. This changing transfer function may be accommodated by occasionally updating the look-up table of predistortion values.

The first portion of the input signal is used to select predistortion values from the look-up table, passing the subject predistortion values to an amplitude modulating component of the second predistortion component 186 and a phase modulating component of the second predistortion component 186. The amplitude modulating component receives the first portion of the input signal and outputs a derived signal that has been boosted or attenuated in an amount defined by the amplitude predistortion value. The phase modulating component receives the derived signal output by the amplitude modulating component and outputs a derived signal that has been phase shifted by an amount and in a sense defined by the phase predistortion value. The output of the phase modulating component is provided to the main amplifier 162. The adaptation of the first portion of the input signal may be performed in the analog domain at radio frequency and then provided to the main amplifier 162. Alternatively, the adaptation of the first portion of the input signal may be performed in the analog domain at baseband frequency and thereafter up-converted before providing to the main amplifier 162. Alternatively, the first portion of the input signal may be a baseband digital signal, the adaptation may be performed in the digital domain, the adapted signal may then be digital-to-analog converted and up-converted to radio frequency before providing to the main amplifier 162. In alternative embodiments, other transitions between digital and analog domains and between radio frequency, intermediate frequency, and baseband frequency are contemplated. For example, it is possible to have the output of the digital-to-analog converter be at an intermediate frequency of a radio frequency, where the intermediate frequency and radio frequency might be generated in the digital domain. In some cases the adaptation of the first portion of the input signal may be said to be predistorted. In some cases, however, in addition to traditional linearizing predistortion, further adaptation of the first portion of the input signal may be performed.

In an embodiment, the inputs and outputs to and from the second predistortion component 186 are radio frequency (RF) analog, but the second predistortion component 186 performs its internal processing at digital baseband frequency. In this embodiment, inputs to the second predistortion component 186 are down-converted and analog to digital converted and outputs are analog-to-digital converted and then up-converted. In an alternative embodiment, the first portion of the input signal may be baseband digital. It will be appreciated that the present disclosure contemplates yet other dispositions for the second predistortion component 186 conditioning of the input and output signals. For further details of one contemplated approach for providing predistortion, see U.S. Pat. No. 6,275,685, filed Dec. 10, 1998, issued Aug. 14, 2001, entitled "Linear Amplifier Arrangement," by David N. Wessel, et al., which is incorporated by reference herein in its entirety. It is understood that the present disclosure is consistent with and contemplates other methods or determining, storing, and providing predistortion and/or adaptation of the first portion of the input signal.

In the description of the determination of predistortion values by the second predistortion component 186 above, the predistortion values were determined based on the difference between the first portion of the input signal and the scaled and conditioned output of the main amplifier 162. The simple correction by predistortion that flows from only comparing input to output promotes linearization of the main amplifier 162. In an embodiment, however, the desired transfer function of the main amplifier 162 is more complicated. In this case, the output of the main amplifier 162 may be compared to a value other than the unconditioned input to determine the predistortion values. For example, in an embodiment, the first portion of the signal input may be first processed according to the desired transfer function, and this transformed value may then be compared to the conditioned output of the main amplifier 162 to determine the predistortion values.

The behavior of the first predistortion component 182 is largely similar to that of the second predistortion component 186 with some exceptions that will now be described. In an embodiment, the auxiliary amplifier 168 is biased so as to turn ON only when the amplitude of the second portion of the input signal exceeds a predefined threshold. For example, in an embodiment, the auxiliary amplifier 168 may be biased for Class C operation.

Alternatively, in an embodiment, the auxiliary amplifier 168 may be biased for Class B operation, and the signal splitter 160 may perform input signal shaping. For example, the signal splitter 160 may provide a constant fraction of the input signal as the first portion of the input signal to the second predistortion component 186 and the main amplifier 162 but may provide the second portion of the input signal to the first predistortion component 182 and to the auxiliary amplifier 168 only when the input signal exceeds a threshold value. This kind of input conditioning may be referred to as input signal shaping and can be used to adapt out some of the undesirable effects that may be experienced when the auxiliary amplifier 168 is transitioning between a fully OFF state to a fully ON state and between the fully ON state to the fully OFF state. For further details about signal shaping, see U.S. patent application Ser. No. 12/482,110 filed Jun. 10, 2009, entitled "Doherty Amplifier and Method for Operation Thereof," by Gregory J. Bowles, et al., which is incorporated by reference herein in its entirety. Alternatively, in an embodiment, the signal shaping functionality may not be performed by the signal splitter 160 but instead may be incorporated into or integrated with the predistortion processing provided by the first predistortion component 182.

While the above description of providing predistortion in a multiple amplification path amplification unit has been directed to a Doherty amplifier architecture, it will be appreciated by one skilled in the art that many of the novel features described may be applicable to other multiple amplification path amplification units, for example in LINC amplifiers. In the case of a LINC amplification unit, it may be that the predistortion and/or adaptation of the first portion of the input signal may be directed to adapting phase only, in view of the principle of operation of LINC amplification units, for example substantially constant amplitude inputs to each of the first amplifier and the second amplifier. On the other hand, even in LINC amplification units, there may be small imbalances of amplitude outputs of the separate amplifier paths that may be compensated by amplitude predistortion.

Figure 3:
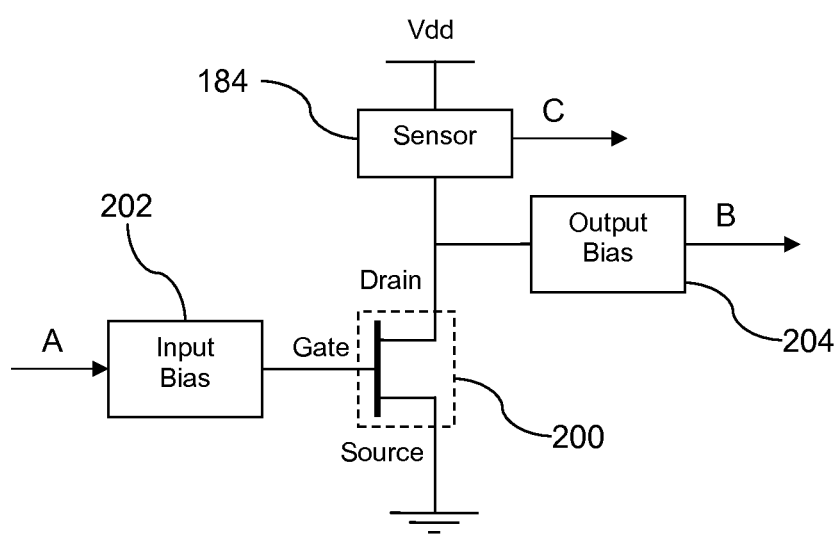
FIG. 3 is an illustration of an output transistor in a portion of a power amplifier according to an embodiment of the disclosure.

Turning now to FIG. 3, details of an embodiment of an output stage of an amplifier is described. In an embodiment, the output stage illustrated in FIG. 3 may be used to implement the output stage of the main amplifier 162 and/or the output stage of the auxiliary amplifier 168. An output transistor 200 is shown as a field effect transistor (FET) having a drain coupled to power source Vdd and to an output bias 204, a gate coupled via an input bias 202 to input signal A, and a source coupled to ground. In another embodiment, however, the output stage of the amplifier may not be implemented using a FET output transistor. In an embodiment, the output stage of the amplifier may be implemented using a bijunction transistor (BJT). The output transistor 200 provides output signal B via the output bias 204. The second sensor 184 is shown coupled to the drain of the output transistor 200 and outputting an amplitude and phase indication C. While not illustrated in FIG. 3 to avoid cluttering the drawing, it is understood that the output transistor 200 operates in the radio frequency range and is isolated from the direct current of the Vdd by appropriate isolation circuitry, for example a DC blocking capacitor to ground and an in-line inductor and/or choke. Likewise, appropriate radio frequency input matching lines may couple the input signal A to the output transistor 200, and radio frequency output matching lines may couple the output signal B to the output transformer 164.

In an embodiment, the second sensor 184 is a current sensor. In an embodiment, the second sensor 184 may be implemented as a transformer current sensor. Alternatively, the second sensor 184 may be implemented as a low resistance, for example about 1 ohm, and may output a voltage value that is an indication of the current through the resistance.

It is understood that alternative predistortion and sensor architectures are also contemplated by the present disclosure. For example, in an embodiment, the first sensor 180 and the first predistortion component 182 illustrated in FIG. 2 may be dispensed with, and instead a sensor (not shown) may sense the output of the output signal combiner 170 and provide this to a predistortion component (not shown) that predistorts the signal input to the signal splitter 160 based on the output of the output signal combiner 170, thereby providing a predistortion loop around the power amplifier 108. In another embodiment, the second sensor 184 may be omitted and the output of the main amplifier 162 may be inferred based on the outputs of the first sensor 180 and the sensor on the output of the output signal combiner 170 and based on subtraction and modeling. The inferred output of the main amplifier 162 may then be input to the second predistortion component 186 in lieu of the output of the second sensor 184. It is understood that the techniques and structures disclosed herein with reference to the power amplifier 108 having a first and second amplifier can be applied to other power amplifiers having three or more amplifiers.

Figure 4:
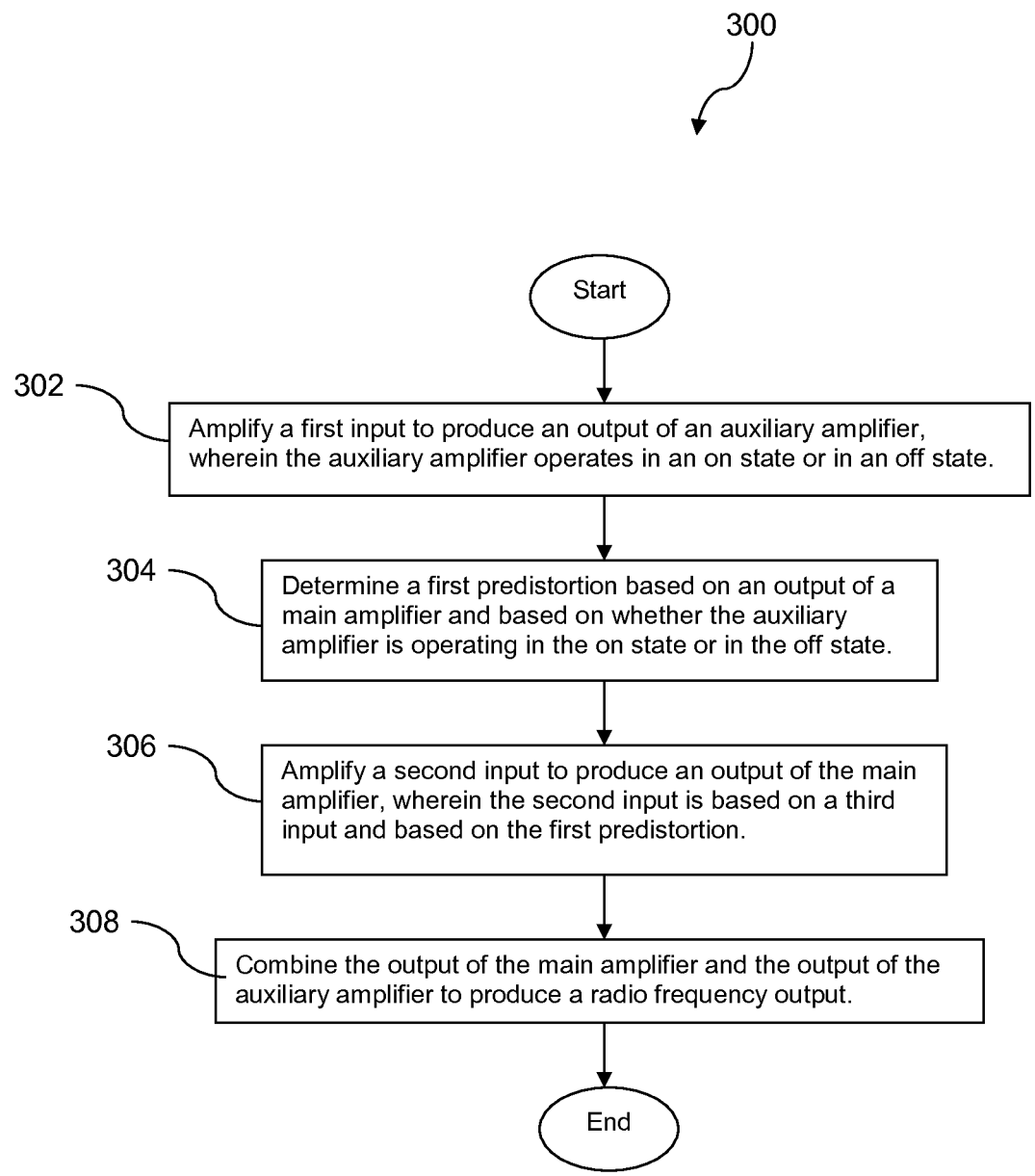
FIG. 4 is an illustration of a method according to an embodiment of the disclosure.

Turning now to FIG. 4, a method 300 is described. At block 302, a first input is amplified to produce an output of an auxiliary amplifier, wherein the auxiliary amplifier operates in an ON state or in an OFF state. It is understood that during transitions between the ON state and the OFF state the auxiliary amplifier may operate in an intermediate state, as described further above. In an embodiment, the auxiliary amplifier of block 302 corresponds to the auxiliary amplifier 168 described above. The ON state, the OFF state, and intermediate states of the auxiliary amplifier may be determined by amplifier bias applied to the auxiliary amplifier, by gate enable signals, by signal shaping, or by a combination thereof.

At block 304, a first predistortion is determined based on an output of a main amplifier and based on whether the auxiliary amplifier is operating in the on state or in the off state. For example, the main amplifier corresponds to the main amplifier 162 described above, and the first predistortion is determined based on a value of impedance seen by the main amplifier 162 as imputed by the ON state or the OFF state of the auxiliary amplifier. In an embodiment, the first predistortion may be determined by a more complicated process, for example by imputing impedance values that are seen by the main amplifier as the auxiliary amplifier transitions between the ON state and the OFF state, for example as described above with reference to impedance mapping. The determination of the first predistortion may also be based on the value of an input to the main amplifier, for example the first portion of the input signal. The determination of the first predistortion may also be based on a desired transfer function of the main amplifier. In en embodiment, the desired transfer function of the main amplifier deviates from a substantially linear transfer function. In an embodiment, the first predistortion—as well as other values of predistortion determined at different operating points—is stored in a look-up table.

At block 306, a second input is amplified to produce an output of the main amplifier, wherein the second input is based on a third input and based on the first predistortion. In embodiment, the second input is the output of the amplitude and phase modulator components of the second predistortion component 186 described above with reference to FIG. 2. The third input may be the first portion of the input signal and may be modulated by the amplitude modulator component and by the phase modulator component of the second predistortion component 186. The third input may be used by the second predistortion component 186 to select the first predistortion.

At block 308, the output of the main amplifier and the output of the auxiliary amplifier are combined to produce a radio frequency output. For example, the output of the main amplifier is transformed and is combined substantially in-phase with the output of the auxiliary amplifier.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

The invention claimed is:

1. An amplification unit, comprising:
    a first amplifier, wherein the first amplifier is operable to amplify a first signal to produce a second signal;
    a first sensor, wherein the first sensor is operable to produce a third signal based on the second signal;
    a second amplifier, wherein the second amplifier is operable to turn on and to amplify a fourth signal to produce a fifth signal when the amplitude of the fourth signal exceeds a threshold amplitude and to turn off when the amplitude of the fourth signal is less than the threshold amplitude;
    a first predistortion component, wherein the first predistortion component is operable to produce the first signal based on a first input signal, based on the third signal, and based on an on-off state of the second amplifier; and
    a signal combiner, wherein the signal combiner is operable to produce an output of the amplification unit based on the second signal and the fifth signal.

2. The amplification unit of claim 1, wherein the second amplifier is biased as a Class B amplifier.

3. The amplification unit of claim 1, wherein the first sensor is a radio frequency coupler located between an output of the first amplifier and the signal combiner.

4. The amplification unit of claim 1, wherein the first sensor is a current monitor located between an output of the first amplifier and the signal combiner, wherein the first sensor produces the third signal based on a current output by the first amplifier.

5. The amplification unit of claim 1, wherein the amplification unit comprises a Doherty amplifier.

6. The amplification unit of claim 5, further comprising:
a second sensor, wherein the second sensor is operable to produce a sixth signal based on the fifth signal;
a second predistortion component, wherein the second predistortion component is operable to produce the fourth signal based on a second input signal and based on the sixth signal.

7. The amplification unit of claim 1,
wherein the first amplifier is formed from at least one semiconductor having a first material composition and belonging to a first semiconductor family;
wherein the second amplifier is formed from at least one semiconductor having a second material composition and belonging to a second semiconductor family; and
wherein at least one of the first material composition is different from the second material composition and the first semiconductor family is different from the second semiconductor family.

8. An amplification unit, comprising:
a first amplifier that receives a first signal and outputs a second signal, wherein the first amplifier amplifies the first signal to produce the second signal;
a sensor that senses the second signal and outputs a third signal, wherein the third signal is based on the second signal;
a second amplifier that receives a fourth signal and that outputs a fifth signal, wherein the second amplifier amplifies the fourth signal to produce the fifth signal;
a predistortion component that determines predistortion values based at least in part on the third signal and that outputs the first signal based on a first input signal and the predistortion values; and
a signal combiner, wherein the signal combiner outputs a sixth signal based on the second signal and based on the fifth signal, wherein the sensor is located between the output of the first amplifier and the signal combiner.

9. The amplification unit of claim 8, further comprising a phase shift component that phase shifts the second signal, wherein the phase shift component is located between the sensor and the signal combiner.

10. The amplification unit of claim 8, wherein the first signal and the fourth signal are substantially constant amplitude signals.

11. The amplification unit of claim 8, wherein the predistortion component determines the predistortion values further based on an operating state of the second amplifier.

12. The amplification unit of claim 11, wherein the third signal indicates a current in an output transistor of the first amplifier, and wherein the predistortion component determines the predistortion values based on converting the current indication of the third signal to a voltage indication, wherein converting the current indication to a voltage indication is based on a first known output impedance seen by the first amplifier during a first operating state of the second amplifier and based on a second known output impedance seen by the first amplifier during a second operating state of the second amplifier.

13. The amplification unit of claim 8, wherein the predistortion component comprises an adapter component that determines a plurality of predistortion values and a correction component that modifies the first input signal based on at least one predistortion value selected from the plurality of predistortion values, where the at least one predistortion value is selected from the plurality of predistortion values based on the first input signal.

14. The amplification unit of claim 13, wherein the correction component modifies the first input signal based on a predistortion gain value and based on a predistortion phase value selected from the plurality of predistortion values.

15. A method of amplifying electronic signals to produce a radio frequency output, comprising:
amplifying a first input to produce an output of a second amplifier, wherein the second amplifier operates in an on state or in an off state;
determining a first predistortion based on an output of a first amplifier and based on whether the second amplifier is operating in the on state or in the off state;
amplifying a second input to produce an output of a first amplifier, wherein the second input is based on a third input and based on the first predistortion; and
combining the output of the first amplifier and the output of the second amplifier to produce a radio frequency output.

16. The method of claim 15, wherein the first predistortion is determined based on a first output impedance experienced by the first amplifier when the second amplifier operates in the on state and based on a second output impedance experienced by the first amplifier when the second amplifier operates in the off state.

17. The method of claim 16, wherein the first predistortion is determined based on the output of the first amplifier upstream of where the output of the first amplifier is combined with the output of the second amplifier to produce the radio frequency output.

18. The method of claim 15, wherein the first amplifier and the second amplifier are arranged in a Doherty amplifier configuration.

19. The method of claim 15, wherein determining the first predistortion is further based on the third input.

20. The method of claim 19, further comprising determining a second predistortion based on the output of the second amplifier and based on the first input, wherein the second amplifier further amplifies the second predistortion when producing the output of the second amplifier.

* * * * *